US012742835B2

(12) United States Patent
Dellis et al.

(10) Patent No.: US 12,742,835 B2
(45) Date of Patent: Sep. 22, 2026

(54) TECHNIQUES FOR ATOMIC MAGNETOMETERS AND ATOMIC MAGNETIC GRADIOMETERS

(71) Applicant: Honeywell International Inc., Charlotte, NC (US)

(72) Inventors: Argyrios Dellis, Plymouth, MN (US); Chad Fertig, Roseville, MN (US)

(73) Assignee: Honeywell Aerospace US LLC, Phoenix, AZ (US)

(*) Notice: Subject to any disclaimer, the term of this patent is extended or adjusted under 35 U.S.C. 154(b) by 159 days.

(21) Appl. No.: 18/898,277

(22) Filed: Sep. 26, 2024

(65) Prior Publication Data

US 2026/0086173 A1 Mar. 26, 2026

(51) Int. Cl.
*G01R 33/032* (2006.01)

(52) U.S. Cl.
CPC .................................. *G01R 33/032* (2013.01)

(58) Field of Classification Search
CPC G01R 33/032; G01R 33/022; G01R 33/0017; G01R 33/0047; G01R 33/0052; G01R 33/26
USPC ........................................................ 324/244.1
See application file for complete search history.

(56) References Cited

U.S. PATENT DOCUMENTS 3,487,459 A * 12/1969 Schonstedt .......... G01R 33/022 324/245
3,488,579 A * 1/1970 Schonstedt .......... G01R 33/022 324/245
8,665,443 B2 3/2014 Schober et al.
11,402,241 B2 8/2022 Hoyt et al.
11,448,712 B2 9/2022 Wang
11,460,289 B2 * 10/2022 Ausserlechner ......... G01B 7/30
2007/0205767 A1 * 9/2007 Xu ......................... G01R 33/26 324/307
2011/0031969 A1 2/2011 Kitching et al.
2013/0127458 A1 * 5/2013 Mizutani ................ G01R 33/26 324/301

(Continued)

FOREIGN PATENT DOCUMENTS

CN 104698410 B 3/2019
EP 3029480 A1 6/2016
EP 3748295 A1 * 12/2020 ............ G01P 15/093

OTHER PUBLICATIONS

European Patent Office, "Extended European Search Report", dated Mar. 10, 2026, from EP Application No. 25199535.3, from Foreign Counterpart to U.S. Appl. No. 18/898,277, pp. 1 through 8, Published: EP.

(Continued)

*Primary Examiner* — Christopher P McAndrew
(74) *Attorney, Agent, or Firm* — Fogg & Powers LLC

(57) ABSTRACT

Size, weight, and cost of an atomic magnetic sensor vacuum chamber, and thus an atomic magnetometer and/or an atomic magnetic gradiometer, is reduced by using at least one photonic integrated circuit (PIC). The at least one PIC is configured to receive an optical signal, e.g., from a laser, and to distribute the optical signal to at least one set of two or more grating coupled surface emitters. Each grating coupled surface emitter is configured to collimate, direct, and emit, along a direction of emission, an optical beam, derived from a portion of the optical signal, to an optical detector.

20 Claims, 7 Drawing Sheets

(56) References Cited

U.S. PATENT DOCUMENTS

| | | | | |
|---|---|---|---|---|
| 2013/0320231 | A1* | 12/2013 | Schober | G02B 27/00<br>250/428 |
| 2017/0343621 | A1* | 11/2017 | Hahn | G01R 33/1284 |
| 2020/0348370 | A1* | 11/2020 | Garber | H05K 9/0071 |
| 2021/0405136 | A1* | 12/2021 | Arroyo Camejo | G01R 33/323 |
| 2022/0018910 | A1 | 1/2022 | Wang | |
| 2022/0091200 | A1* | 3/2022 | Gerginov | G01R 33/26 |
| 2022/0214411 | A1* | 7/2022 | Butters | G01R 33/032 |
| 2023/0184553 | A1 | 6/2023 | Morrison et al. | |
| 2024/0203616 | A1 | 6/2024 | Blumenthal et al. | |

OTHER PUBLICATIONS

Ben-Kish et al., “Dead-Zone-Free Atomic Magnetometry with Simultaneous Excitation of Orientation and Alignment Resonances”, Physical Review Letters, vol. 105, No. 193601, week ending Nov. 5, 20210, pp. 193601-1 through 109601-4.

Heppner, “The world magnetic survey”, National Aeronautics and Space Administration, 1964, as downloaded Mar. 7, 2024 from https://hdl.handle.net/2027/uiug.30112106773507, pp. Title p. through 47.

Puckett et al., “Optical Grating Configured to Emit an Optical Beam Having a Predetermined Cross-Section and an Predetermined Intensity Pattern Over Such Cross-Section”, U.S. Appl. No. 18,587,135, filed Feb. 26, 2024, pp. 1 through 26, Published: US.

* cited by examiner

100
Processing System 109
Electrical Supply 107
Laser 102
PIC 106

114
116-1
116-2
116-3
117
118
119
119-1
119-2
119-3
119-4
101
110
103-1
103-2
103-3
113-1
113-2
113-3
104-1
104-2
104-3
105-1
105-2
105-3
105-4
105-5
105-6
115-1
115-2
115-3
181-1
181-2
181-3
102-1

293
229-2
229-1
229-2
205
228
P
R
202-1'
225

P
R
228
228-1

229
229-1
229-2
225

TECHNIQUES FOR ATOMIC MAGNETOMETERS AND ATOMIC MAGNETIC GRADIOMETERS

BACKGROUND

A magnetometer may be used as a navigation aide, a bio-magnetic field sensor, a sensor for detecting magnetic bodies, a battery quality sensor, and other applications. An atomic magnetometer is one type of magnetometer. Current atomic magnetometers are large, heavy, and costly, and as a result are not as widely deployed as they may otherwise be.

SUMMARY

In some aspects, the techniques described herein relate to an apparatus for sensing changes in an external magnetic field, the apparatus including: a package including an interior surface and an atomic magnetic sensor vacuum chamber; at least one photonic integrated circuit (PIC) mounted on the interior surface and including at least one set of at least two grating coupled surface emitters, and at least one set of at least one planar optical waveguide each of which is coupled to a set of at least two grating coupled surface emitters, wherein each at least one planar optical waveguide is configured to receive a continuous wave optical signal, and wherein each of the at least two grating coupled surface emitters of a set is configured to emit an optical beam; for each set, at least two optical detectors each of which are mounted on and/or in the package, wherein each of the at least two optical detectors is configured to receive an emitted optical beam along a direction of emission between an optical detector and a unique grating coupled surface emitter which emits the emitted optical beam; for each set, at least two portions of a vapor of atoms in the atomic magnetic sensor vacuum chamber, wherein each portion is in one direction of emission; and at least one coil each of which is in and/or on the package and is configured to generate a magnetic field in at least one portion of the vapor of atoms.

In some aspects, the techniques described herein relate to a method for sensing changes in an external magnetic field, the method including: for each set of at least one set of at least two grating coupled surface emitters, emitting at least two optical beams, wherein each of the at least two optical beams is emitted from a unique grating coupled surface emitter formed on at least one photonic integrated circuit (PIC), along a direction of emission, through a portion of a vapor of atoms in a measurement volume in an atomic magnetic sensor vacuum chamber, and to an optical detector, and wherein the PIC and the vapor of atoms are in a package; for each set of at least two grating coupled optical surface, generating at least two electrical signals, wherein each electrical signal is generated by a unique optical detector upon which one of at least one optical beam is incident after propagating through a unique portion of a vapor of atoms, wherein each electrical signal has a parameter value proportional to optical energy of at least one optical beam incident on the unique optical detector, wherein the unique optical detector is in and/or on the package; and for each set of at least two grating coupled surface emitters, determining a strength of the external magnetic field in portions, of the vapor of atoms, through which the at least two optical beams propagate.

In some aspects, the techniques described herein relate to an apparatus for sensing changes in an external magnetic field, the apparatus including: a package including an interior surface and an atomic magnetic sensor vacuum chamber; at least one photonic integrated circuit (PIC) mounted on the interior surface and including at least one set of at least two grating coupled surface emitters, and at least one set of at least one planar optical waveguide each of which is coupled to a set of at least two grating coupled surface emitters, wherein each at least one planar optical waveguide is configured to receive a continuous wave optical signal, and wherein each of the at least two grating coupled surface emitters of a set is configured to emit an optical beam; for each set, at least two optical detectors each of which are mounted on and/or in the package, wherein each of the at least two optical detectors is configured to receive an emitted optical beam along a direction of emission between an optical detector and a unique grating coupled surface emitter which emits the emitted optical beam; for each set, at least two portions of a vapor of atoms in the atomic magnetic sensor vacuum chamber, wherein each portion is in one direction of emission; at least one coil each of which is in and/or on the package and is configured to generate a magnetic field in at least one portion of the vapor of atoms; a laser optically coupled to each set of at least one planar optical waveguide and configured to generate the continuous wave optical signal; an electrical supply configured to provide direct current (DC) and/or alternating current (AC) to each of the at least one coil; and processing circuitry electrically coupled to each of the at least two optical detectors and configured to determine at least one field strength of the external magnetic field and/or at least one magnetic gradient of the external magnetic field.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments. Reference characters denote like elements throughout figures and text.

DETAILED DESCRIPTION

Figure 1:
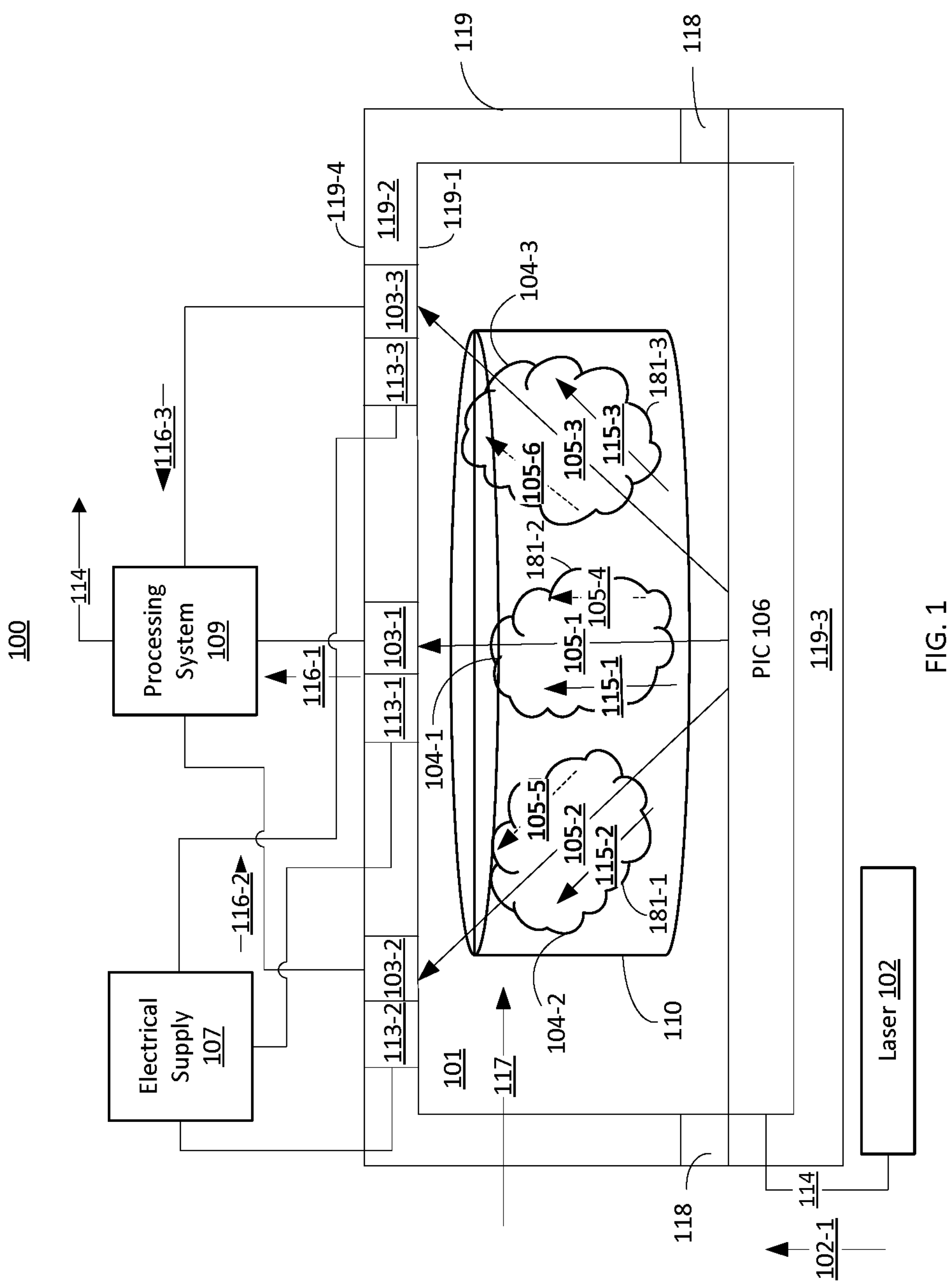
FIG. 1 illustrates a diagram of one embodiment of an atomic magnetometer according to embodiments of the invention.

In the following detailed description, reference is made to the accompanying drawings that form a part hereof, and in which is shown by way of illustration specific illustrative embodiments. However, it is to be understood that other embodiments may be utilized, and that structural, mechanical, and/or electrical changes may be made. Furthermore, each method presented in the drawing figures and the specification is not to be construed as limiting the order in which the individual steps may be performed. The following detailed description is not to be taken in a limiting sense.

Embodiments of the invention provide a technological improvement to atomic magnetometers and atomic magnetic gradiometers by reducing the size, weight, and cost of an atomic magnetic sensor vacuum chamber used to implement such sensors. Embodiments of the invention utilize at least one photonic integrated circuit (PIC). The at least one PIC is configured to receive an optical signal, e.g., from a laser, and to distribute the optical signal to at least one set of two or more grating coupled surface emitters. Each grating coupled surface emitter is configured to collimate, direct, and emit, along a direction of emission, an optical beam, derived from a portion of the optical signal, to an optical detector. At least two direction of emissions are different, e.g., orthogonal, to one another. Each grating coupled surface emitter includes a pattern on a surface of the PIC that bends light, e.g., into an optical beam. An exemplary grating coupled surface emitter is illustrated in U.S. patent application Ser. No. 18/587,135 filed on Feb. 26, 2024 and is incorporated by reference in its entirety herein.

An atomic magnetometer and an atomic magnetic gradiometer utilizing a single optical beam suffers from non-uniform sensitivity in a measurement volume including regions of low or no sensitivity. Thus, the atomic magnetometer and the atomic magnetic gradiometer utilizing a single optical beam may mischaracterize an external magnetic field in its measurement volume. Thus, a measurement volume has a more uniform and non-zero sensitivity, e.g., spatially isotropic sensitivity, when at least two optical beams with different, e.g., orthogonal, lines of sights are used. Therefore, embodiments of the invention also provide a technical improvement to atomic magnetometers by more accurately determining magnetic field strength and to atomic magnetic gradiometers by more accurately determining gradient(s) of magnetic field strength.

When embodiments of the invention are used with or are a certain type of atomic magnetometer, e.g., a Bell-Bloom atomic magnetometer, then at least two optical beams and hence at least two lines of sight are required. When embodiments of the invention are used with or are another type of atomic magnetometer, e.g., an Mz atomic magnetometer, then at least three optical beams and hence at least three lines of sight are required.

FIG. 1 illustrates a diagram of one embodiment of an atomic magnetometer 100 according to embodiments of the invention. The embodiment illustrated by FIG. 1 may be used as an atomic magnetic gradiometer when two or more sets of at least two optical beams are employed. For pedagogical purposes, an atomic magnetometer 100 with a single set of at least two optical beams, e.g., three optical beams, is illustrated in FIG. 1. The atomic magnetic gradiometer implemented according to embodiments of the invention is further described elsewhere herein.

The atomic magnetometer 100 comprises an atomic magnetic sensor vacuum chamber 101, an optional laser 102, an optional laser optical waveguide 114, an optional electrical supply 107, and an optional processing system (or processing circuitry) 109. The optional laser 102 is optically coupled to the atomic magnetic sensor vacuum chamber 101 by the optional laser optical waveguide 114 (e.g., an optical fiber, a planar optical waveguide, or any other type of optical waveguide). The optional laser 102 is configured to emit a continuous wave (CW) optical signal 102-1.

For pedagogical purposes, the optional laser optical waveguide 114 is illustrated as penetrating a portion of the package 119 and being directly optically coupled to the PIC 106. Optionally, the package 119 is partially or wholly optically clear. Optionally and alternatively, the optional laser optical waveguide 114 may be optically coupled to an exterior surface 119-4 of an optically clear portion of the package 119; in such case, the optional laser optical waveguide need not penetrate the package 119, and the CW optical signal 102-1 propagates from the optional laser optical waveguide 114 through the optically clear portion to the PIC 106. Alternatively, the optional laser optical waveguide 114 need not be used if the optical beam emitted by the optional laser 102 is directed through the optically clear portion to the PIC 106.

The optional laser 102 is illustrated as being outside of the package 119. Alternatively, the optional laser 102 may be inside of the package 119. The optional laser optical waveguide 114 may not be needed. The CW optical signal 102-1 may be configured to be coupled through, e.g., an optically clear portion of the package to the PIC 106 or when inside of the package 119 may be adjacent to the PIC 106 so that the optional laser optical waveguide 114 is not needed.

The atomic magnetic sensor vacuum chamber 101 includes a package 119, a photonic integrated circuit (PIC) 106, a first optical detector 103-1, a second optical detector 103-2, a third optical detector 103-3, an optional first coil and/or heater 113-1, an optional second coil and/or heater 113-2, and an optional third coil and/or heater 113-3. The PIC 106 is mounted in a package 119, e.g., on an interior surface 119-1 of the package 119. Although three optional coils and/heaters are illustrated in FIG. 1 for pedagogical purpose, embodiments of the invention optionally may include at least one coil and/or heater. Although the optional coils and/or heaters may be co-located, if both are used then in other embodiments they may be not be co-located.

The optional heater(s) are used to temperature stabilize the atomic magnetic sensor vacuum chamber 101, and its constituent components including each portion of a vapor of atoms therein, to increase measurement sensitivity of the atomic magnetometer 100. The optional coil(s) are used to optionally generate a direct current (DC) magnetic field (with DC) to induce the Zeeman effect and aligned spin states of the vapor of atoms, and to optionally generate an alternating current (AC) magnetic field (with AC) to induce magnetic resonance in the vapor of atoms.

Each optical detector 103-1, 103-2, 103-3 is a photodiode, a photodiode whose electrical output is electrically coupled to a transimpedance amplifier, or any other type of optical detector. Each optical detector 103-1, 103-2, 103-2 is configured to convert optical energy incident on the optical detector to an electrical signal 116-1, 116-2, 116-3. Optionally, the current or the voltage level of the electrical signal is proportional to the optical energy incident on the optical detector. Each optical detector 103-1, 103-2, 103-3 is electrically coupled to the optional processing system 109. Although for pedagogical purposes FIG. 1 illustrates the atomic magnetic sensor vacuum chamber 101 having three optical detectors 103-1, 103-2, 103-3, the atomic magnetic sensor vacuum chamber 101 may have at least two optical detectors, e.g., at least three optical detectors. For pedagogical purposes, FIG. 1 illustrates that each optical detector 103-1, 103-2, 103-3 is embedded in the package 119; however, each optical detector may be mounted on and/or affixed to the interior surface 119-1 of the package 119 or otherwise mounted on and/or in the package 119 in another way so that it can detect an optical beam emitted in the package 119.

Each coil of an optional coil and/or heater 113-1, 113-2, 113-3 is a coil of electrical conductor. Each heater of an optional coil and/or heater 113-1, 113-2, 113-3 is a resistive heater and/or any other type of heater. Each optional coil and/or heater 113-1, 113-2, 113-3 is electrically coupled to the optional electrical supply 107. Optionally, a unique heater is provided for each portion of vapor of atoms 104-1, 104-2, 104-3. Optionally, a unique coil is provided for each portion of vapor of atoms 104-1, 104-2, 104-3. The optional electrical supply 107 is configured to provide a direct current (DC) and/or alternating current (AC) (e.g., at a radio frequency) to each coil to which it is electrically coupled. The optional electrical supply 107 is further configured to provide electrical power and optionally an electrical control signal to each heater. Optionally, each heater is configured to receive its own optional electrical control signal which is used to selectively activate and deactivate an individual heater. For pedagogical purposes, FIG. 1 illustrates that each optional coil and/or heater 113-1, 113-2, 113-3 is embedded in the package 119; however, each optional coil and each optional heater may be mounted on or affixed to an interior surface 119-1 and/or an exterior surface of the package or otherwise mounted on and/or in the package in another way so that each coil can provide magnetic field(s) in the measurement volume 110, e.g., in the portions of the atomic vapors, in the package 119 and so that each heater can adjust a temperature of the package 119, for example, in the measurement volume 110, e.g., in the portions of the atomic vapors, in the package 119. Optionally, each optional coil and/or heater may be located on and/or in the upper or lower body 119-2, 119-3.

Although three optional coils and/heaters are illustrated in FIG. 1 for pedagogical purpose, embodiments of the invention optionally may include at least one coil and/or heater. Each of the at least one coil and/or heater may be implemented in and/or on the package as described herein or elsewhere. Each coil of the at least one coil is configured to generate magnetic field(s) in at least one portion of the vapor of atoms.

The package 119 includes a vapor of atoms 104-1, 104-2, 104-3 in substantially a vacuum in the atomic magnetic sensor vacuum chamber 101. The vapor of atoms includes sense atoms which are non-inert atoms, e.g., alkali atoms. Optionally, the vapor of atoms co-exists with a buffer gas vapor 181-1, 181-2, 181-3 which includes non-sense atoms, e.g., inert atoms or compounds (for example, nitrogen, helium, and/or argon). The buffer gas vapor may be used, for example, to maintain orientation of spin of the atoms of the vapor of atoms.

Optionally, the package includes a lower body 119-3 affixed to an upper body 119-2. Optionally, the lower body 119-3 and the upper body 119-2 are affixed with bonding material 118. Optionally, the package 119 is formed with an insulator, e.g., undoped silicon and/or glass (e.g., borosilicate glass). Optional, the lower and the upper bodies 119-3, 119-2 are formed from silicon, and the bonding material 118 is formed from glass; optionally and alternatively, the lower and the upper bodies 119-3, 119-2 are formed from glass, and the bonding material 118 is formed from silicon. Optionally, the glass is optically clear.

Figure 2A:
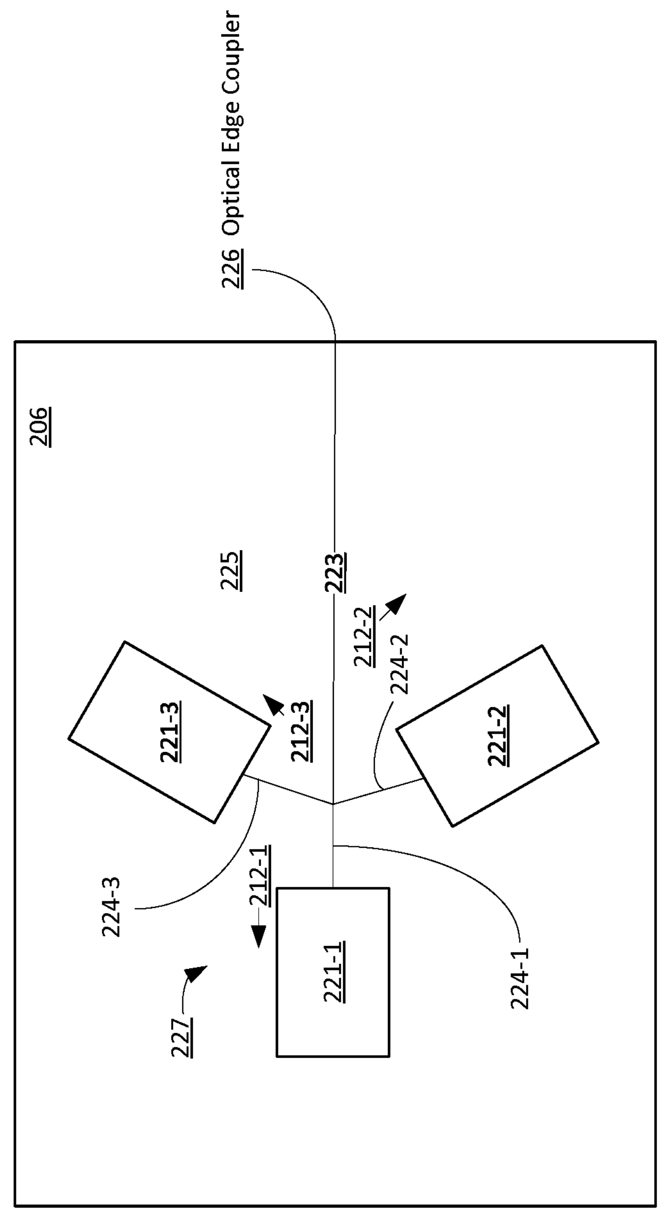
FIG. 2A illustrates a plan view of one embodiment of a photonic integrated circuit implementing a single set of at least two grating coupled surface emitters.

FIG. 2A illustrates a plan view of one embodiment of a photonic integrated circuit 206 implementing a single set of at least two grating coupled surface emitters 227. The single set 227 may be used to generate at least two, e.g., three, optical beams, used to implement an atomic magnetometer. In the photonic integrated circuit 206 each grating coupled surface emitter is coupled to at least one optical waveguide. The illustrated photonic integrated circuit 206 includes an input optical waveguide 223, a first feed optical waveguide 224-1, a second feed optical waveguide 224-2, a third feed optical waveguide 224-3, a first grating coupled surface emitter 221-1, a second grating coupled surface emitter 221-2, and a third grating coupled surface emitter 221-3. Such optical waveguides may be planar optical waveguides. Although three grating coupling surface emitters and three feed optical waveguides are illustrated, two, four, or more than four of each may be used in the PIC 206 to form the single set 227. Each optical waveguide, each grating coupled surface emitter, and the optional edge coupler 226 are formed on a substrate 225, e.g., an insulator, for example, glass, an undoped semiconductor such as silicon, or another insulating material.

Figures 2B, 2C, 2D:
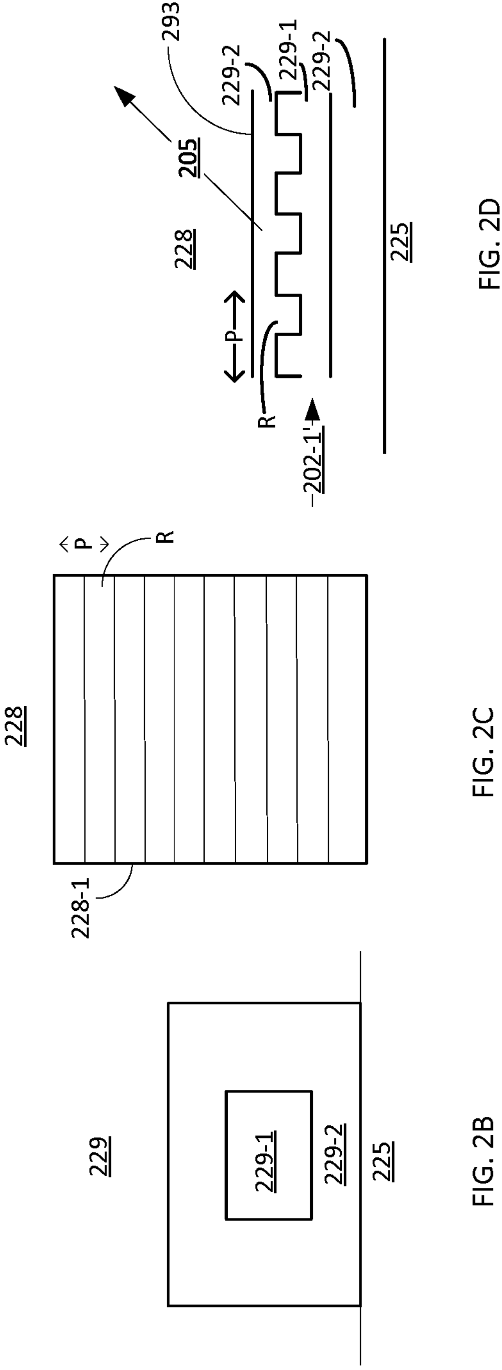
FIG. 2B illustrates a cross sectional diagram of one embodiment of a planar optical waveguide.
FIG. 2C illustrates a plan view of one embodiment of a grating coupled surface emitter.
FIG. 2D illustrates a cross-sectional view of one embodiment of a grating coupled surface emitter.

FIG. 2B illustrates a cross sectional diagram of one embodiment of a planar optical waveguide 229. Planar optical waveguide may be implemented in alternate ways than as described with respect to FIG. 2B. The planar optical waveguide 229 includes a core 229-1 surrounding a cladding 229-2, wherein an index of refraction of the core 229-1 is larger than an index of refraction the cladding 229-2. Optionally, the cladding 229-2 is formed by silicon dioxide and the core 229-1 is formed by silicon nitride; however, other materials can be used to form the cladding 229-2 and the core 229-1.

FIG. 2C illustrates a plan view of one embodiment of a grating coupled surface emitter 228. A grating coupled surface emitter may be implemented in other ways than as described with respect to FIG. 2C and/or FIG. 2D. The grating coupled surface emitter 228 includes a series of recesses R in the core of a planar optical waveguide with an arbitrary boundary 228-1 which defines beam width and intensity. The recesses have a constant or non-constant period P.

FIG. 2D illustrates a cross-sectional view of one embodiment of a grating coupled surface emitter 228. FIG. 2D illustrates a core 229-1 with recesses R. The core 229-1 is surrounded by cladding 229-2. The cladding 229-2 is over the substrate 225.

The CW optical signal 202-1', or a portion thereof, is received by the grating coupled surface emitter 228. The grating coupled surface emitter 228 is configured to bend and shape the CW optical signal 202-1', or a portion thereof, into an optical beam 205 emitted from the surface 293 of the grating coupled surface emitter 228, e.g., in a desired direction of emission.

Returning to FIG. 2A, the input optical waveguide 223 is configured to receive the CW optical signal 102-1. Optionally, the PIC 106 includes an optional edge coupler 226 configured to couple the CW optical signal 102-1 in free space to the input optical waveguide 223. A first portion of the CW optical signal 212-1 is conveyed to the first grating coupled surface emitter 221-1 through the first feed optical waveguide 224-1. A second portion of the CW optical signal 212-2 is conveyed to the second grating coupled surface emitter 221-2 through the second feed optical waveguide 224-2. A third portion of the CW optical signal 212-3 is conveyed to the third grating coupled surface emitter 221-3 through the third feed optical waveguide 224-2.

Each grating coupled surface emitter 221-1, 221-2, 221-3 is configured to emit, along a direction of emission, an optical beam to an optical detector, e.g., a unique optical detector. Each of the at least two direction of emissions is different. Optionally, each direction of emission is orthogonal.

Returning to FIG. 1, using the first portion 212-1, the first grating coupled surface emitter 221-1 is configured to emit a first optical beam 105-1 along a first direction of emission (DOE) 115-1 and through a first portion 104-1 of a vapor of atoms. Using the second portion 212-2, the second grating coupled surface emitter 221-2 is configured to emit a second optical beam 105-2 along a second direction of emission 115-2 and through a second portion 104-2 of a vapor of atoms. Using the third portion 212-3, the third grating coupled surface emitter 221-3 is configured to emit a third optical beam 105-3 along a third direction of emission 115-3 and through a third portion 104-3 of a vapor of atoms. The grating coupled surface emitters 221-1, 221-2, 221-3 are each configured to emit an optical beam 105-1, 105-2, 105-3 with a same circular polarization, i.e., left handed or right handed circular polarization.

The first grating coupled surface emitter 221-1 is configured so that the first DOE 115-1, and thus the first optical beam 105-1, is incident upon the first optical detector 103-1. The second grating coupled surface emitter 221-2 is configured so that the second DOE 115-2, and thus the second optical beam 105-2, is incident upon the second optical detector 103-3. The third grating coupled surface emitter 221-3 is configured so that the third DOE 115-3, and thus the third optical beam 105-3, is incident upon the third optical detector 103-3. Optionally, the optical beams 105-1, 105-2, 105-3, and thus each pair of the DOEs 115-1, 115-2, 115-3, may be orthogonal to one another. Thus, optionally, the grating coupled surface emitters are configured to generate optical beams each of which is orthogonal to one another; thus, optionally, the lines of sights along which the beams propagate are also orthogonal to one another. Optionally, the optical beams 105-1, 105-2, 105-3, and thus the DOEs 115-1, 115-2, 115-3 may have 1-1-1 orientation.

A magnitude of an external magnetic field 117 intersecting portions 104-1, 104-2, 104-3 of the vapor of atoms in the measurement volume 110, the optical energy of an optical beam 105-1, 105-2, 105-3 propagating through such portion 104-1, 104-2, 104-3 may change, e.g., diminish, due the Zeeman effect. In such case the optical detector 103-1, 103-2, 103-3 upon which such optical beam 105-1, 105-2, 105-3, whose optical energy changed, e.g., diminished, detects such change, e.g., reduction, of optical energy. The change in optical energy is proportional to a change in the external magnetic field 117. Optionally, a change in a parameter, e.g., current or voltage level, of the electrical signal 116-1, 116-2, 116-3 is proportional to the change in the optical energy incident on the optical detector 103-1, 103-2, 103-3 generating the electrical signal, and is thus proportional to the change in a magnitude of magnetic field in the portions of vapor of atoms in the measurement volume 110. Optionally, the optional processing system 109 is configured to average a parameter, e.g., current or voltage level, of each electrical signal 116-1, 116-2, 116-3 received by the optional processing system 109.

Figure 3A:
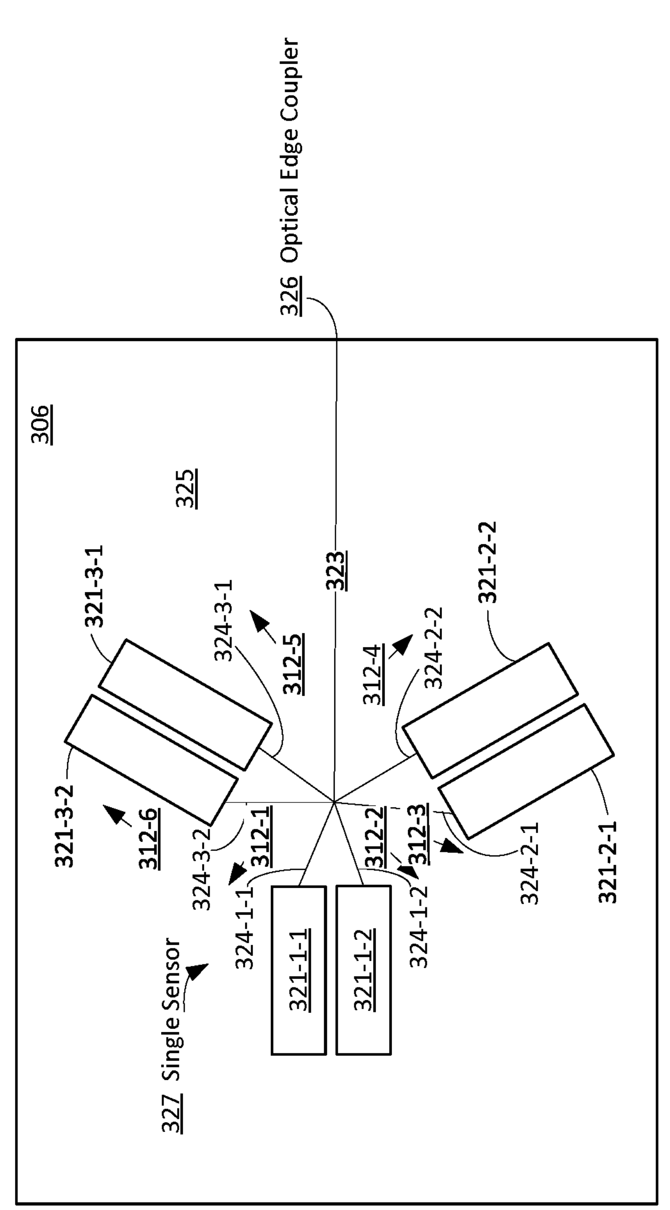
FIG. 3A illustrates a plan view of another embodiment of a photonic integrated circuit configured to implement a single set of at least two grating coupled surface emitters.
Figure 3B:
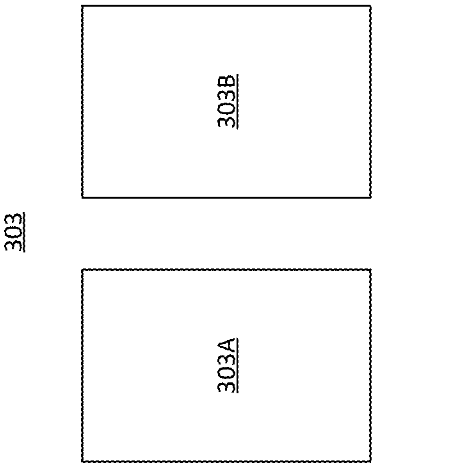
FIG. 3B illustrates a diagram of one embodiment of an optical detector including the first optical sub-detector and the second optical sub-detector.

FIG. 3A illustrates a plan view of another embodiment of a photonic integrated circuit 306 configured to implement a single set 327 of at least two pairs of adjacent grating coupled surface emitters Each pair of grating coupled surface emitters 321-1-1, 321-1-2, 321-2-1, 321-2-2, 321-3-1, 321-3-2 includes a grating coupled surface emitter configured to emit a left handed circularly polarized optical beam and a grating coupled surface emitter configured to emit a right handed circularly polarized optical beam. In such case, each optical detector 103-1, 103-2, 103-2 includes a first optical sub-detector configured to receive the left handed circularly polarized optical beam and a second optical sub-detector, each of which is configured to receive the right handed circularly polarized optical beam. FIG. 3B illustrates a diagram of one embodiment of an optical detector 303 including the first optical sub-detector 303A and the second optical sub-detector 303B. For purposes of clarity and unless otherwise stated herein, each of the optical beams 105-1, 105-2, 105-3 of the embodiment illustrated in FIG. 1 may have a circular, a linear, an elliptical, or a non-polarized polarization.

Returning to FIG. 3A, using pairs of adjacent grating coupled surface emitters facilitates cancelling light shifts and non-linear Zeeman effects. The single set 327 may be used to implement an atomic magnetometer. The photonic integrated circuit 306 includes an input optical waveguide 323, a first feed optical waveguide 324-1-1, a second feed optical waveguide 324-1-2, a third feed optical waveguide 324-2-1, a fourth feed optical waveguide 324-2-2, a fifth feed optical waveguide 324-3-1, a sixth feed optical waveguide 324-3-2, a first grating coupled surface emitter 321-1-1, a second grating coupled surface emitter 321-1-2, a third grating coupled surface emitter 321-2-1, a fourth grating coupled surface emitter 321-2-2, a fifth grating coupled surface emitter 321-3-1, and a sixth grating coupled surface emitter 321-3-2. Such optical waveguides may be planar optical waveguides. Although six grating coupling surface emitters and six feed optical waveguides are illustrated four, eight, or more than eight of each may be used in the PIC 306 to form the single set 327. Each optical waveguide, each grating coupled surface emitter, and the optional edge coupler 326 are formed on a substrate 325.

The input optical waveguide 323 is configured to receive the CW optical signal 102-1. Optionally, the PIC 106 includes an optional edge coupler 326 configured to couple the CW optical signal 102-1 in free space to the input optical waveguide 323. A first portion of the CW optical signal 312-1 is conveyed to the first grating coupled surface emitter 321-1-1 through the first feed optical waveguide 324-1-1. A second portion of the CW optical signal 312-2 is conveyed to the second grating coupled surface emitter 321-1-2 through the second feed optical waveguide 324-1-2. A third portion of the CW optical signal 312-3 is conveyed to the third grating coupled surface emitter 321-2-1 through the third feed optical waveguide 324-2-1. A fourth portion of the CW optical signal 312-4 is conveyed to the fourth grating coupled surface emitter 321-2-2 through the fourth feed optical waveguide 324-2-2. A fifth portion of the CW optical signal 312-5 is conveyed to the fifth grating coupled surface emitter 321-3-1 through the fifth feed optical waveguide 324-3-1. A sixth portion of the CW optical signal 312-6 is conveyed to the sixth grating coupled surface emitter 321-3-2 through the sixth feed optical waveguide 324-3-2.

The first grating coupled surface emitter 321-1-1 is configured to emit a first optical beam 105-1, with a first circular polarization, along or parallel to the first DOE 115-1 and through the first portion 104-1 of a vapor of atoms. The second grating coupled surface emitter 321-1-2 is configured to emit a fourth optical beam 105-4, with a second circular polarization, along or parallel to the first DOE 115-1 and through the first portion 104-1 of a vapor of atoms. The third grating coupled surface emitter 321-2-1 is configured to emit a second optical beam 105-2, with a first circular polarization, along or parallel to the second DOE 115-2 and through the second portion 104-2 of a vapor of atoms. The fourth grating coupled surface emitter 321-2-2 is configured to emit a fifth optical beam 105-5, with a second circular polarization, along or parallel to the second DOE 115-2 and through the second portion 104-2 of a vapor of atoms. The fifth grating coupled surface emitter 321-3-1 is configured to emit a third optical beam 105-3, with a first circular polarization, along or parallel to the third DOE 115-3 and through the third portion 104-3 of a vapor of atoms. The sixth grating coupled surface emitter 321-3-1 is configured to emit a sixth optical beam 105-6, with a second circular polarization, along or parallel to the third DOE 115-3 and through the third portion 104-3 of a vapor of atoms.

The first optical detector 103-1 is configured to receive the first and the fourth optical beams 105-1, 105-4. The second optical detector 103-2 is configured to receive the second and the fifth optical beams 105-2, 105-5. The third optical detector 103-3 is configured to receive the third and the sixth optical beams 105-3, 105-6. The magnetic field strength can be determined as otherwise described elsewhere herein.

The first circular polarization is substantially ninety degrees out of phase with the second circular polarization. Optionally, the first circular polarization has left handed circular polarization and the second circular polarization has right handed circular polarization; optionally and alternatively, the first circular polarization is right handed circular polarization and the second circular polarization is left handed circular polarization The pair of substantially parallel optical beams in each DOE (i.e., the first and the fourth optical beams 105-1, 105-4; the second and the fifth optical beams 105-2, 105-5, and the third and the sixth optical beams 105-3, 105-6) cancel out non-linear Zeeman effects which used in a magnetometer or a magnetic gradiometer improve the sensitivity of such instrument.

Figure 4B:
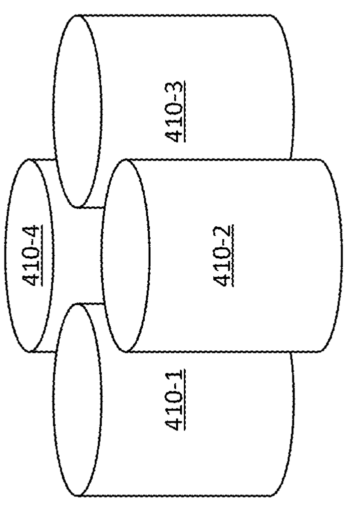
FIG. 4B illustrates a diagram of four measurement volumes.
Figure 4A:
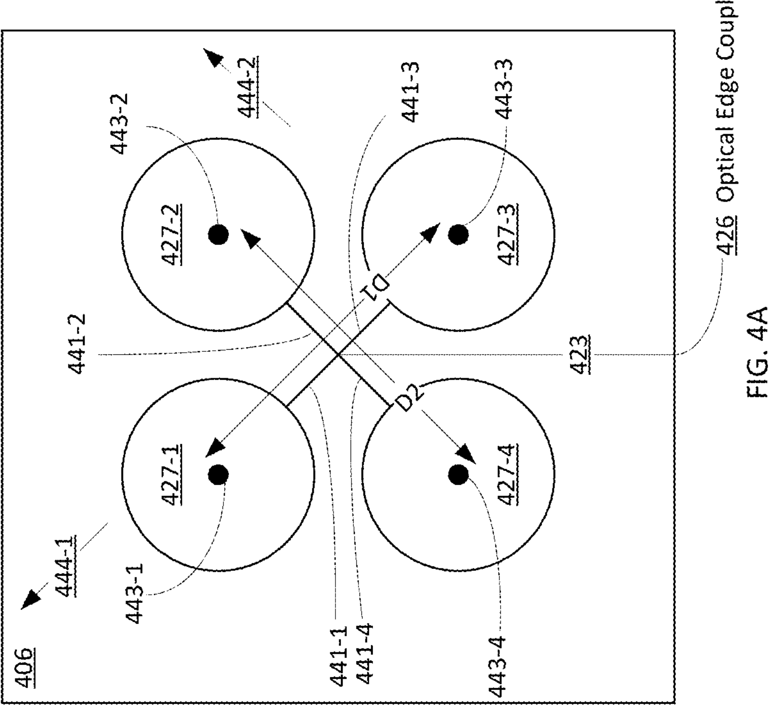
FIG. 4A illustrates a plan view of yet another embodiment of a photonic integrated circuit implementing a more than one set of at least two grating coupled surface emitters.

FIG. 4A illustrates a plan view of yet another embodiment of a photonic integrated circuit 406 implementing a more than one set of at least two grating coupled surface emitters 427-1, 427-2, 427-3, 427-4. Although the photonic integrated circuit 406 is illustrated employing fourth set of at least two grating coupled surface emitters, embodiments of the invention may use two, three, five, or more than five set of at least two grating coupled surface emitters. Each of the sets of at least two grating coupled surface emitters 427-1, 427-2, 427-3, 427-4 may be implemented with an atomic magnetic sensor vacuum chamber 101 described elsewhere herein or a variation thereof. Optionally, the variation would utilize additional optical detectors for the additional optical beams emitted from the additional grating coupled surface emitters of the additional set(s) of the at least two grating coupled surface emitters, and/or additional optional coils and/or heaters. Optionally, such additional optional detectors and coils and/or heaters would be implemented in the atomic magnetic sensor vacuum chamber 101 or variation thereof as described in FIG. 1. For example, each set of at least two grating coupled surface emitters is configured to emit an optical beam from each grating coupled surface emitter to an optical detector, e.g., a unique optical detector. Techniques described with respect to FIG. 2 or 3 may be used for each such set.

The input optical waveguide 423 is configured to receive the CW optical signal 102-1. Optionally, the PIC 406 includes an optional edge coupler 426 configured to couple the CW optical signal 102-1 in free space to the input optical waveguide 423. A first portion of the CW optical signal is conveyed to the first set 427-1 through the first gradiometer feed optical waveguide 441-1. A second portion of the CW optical signal is conveyed to the second set 427-2 through the second gradiometer feed optical waveguide 441-2. A third portion of the CW optical signal is conveyed to the third set 427-3 through the third gradiometer feed optical waveguide 441-3. A fourth portion of the CW optical signal is conveyed to the set 427-4 through the fourth gradiometer feed optical waveguide 441-4. The PIC 406 is configured to be implemented in a package, e.g., as described with respect to FIG. 1.

FIG. 4B illustrates a diagram of four measurement volumes 410-1, 410-2, 410-3, 410-4. Each set 427-1, 427-2, 427-3, 427-4 has a corresponding measurement volume 410-1, 410-2, 410-3, 410-4. Each of the four measurement volumes 410-1, 410-2, 410-3, 410-4 is within the atomic magnetic sensor vacuum chamber 101 illustrated in FIG. 4. Each measurement volume is configured to include portions of vapors of atoms as described elsewhere herein. Returning to FIG. 4A, each measurement volume 410-1, 410-2, 410-3, 410-4 has a corresponding centroid 443-1, 443-2, 443-3, 443-4. A distance D1, D2 between each of two opposite centroids 443-1, 443-3; 443-2, 443-4 is known. In FIG. 4A, the first distance D1 is along a first axis 444-1 and the second distance D2 is along a second axis 444-2. The two axes 444-1, 444-2 are optionally orthogonal. Each axis is formed by at least two centroids along the axis, wherein each centroid is a centroid of a unique measurement volume. The optional processing system 109 is configured to determine a magnetic gradient along each axis 444-1, 444-2 by (a) determining a magnetic field strength for each set 427-1, 427-2, 427-3, 427-4, (b) for each axis, determining a difference of the magnetic field strengths between adjacent centroids along a same axis, and (c) for each axis, determining a magnetic gradient, e.g., by dividing the difference of the magnetic field strengths in adjacent centroids along an axis by the distance between the adjacent centroids along the axis. For example, if only two sets of at least two grating coupled surface emitters are used, then a magnetic gradient can be determined along an axis including centroids of the measurement volume in each of the two atomic magnetometers. For pedagogical purposes, FIG. 4A illustrates measurement volume centroids of only two atomic magnetometers along each axis; however, in other embodiments, more than two measurement volume centroids of more than two atomic magnetometers may be along an axis.

Figure 5:
FIG. 5 illustrates a flow diagram of one embodiment of a method of operating an apparatus including at least one atomic magnetometer according to embodiments of the invention.
Figure 5:
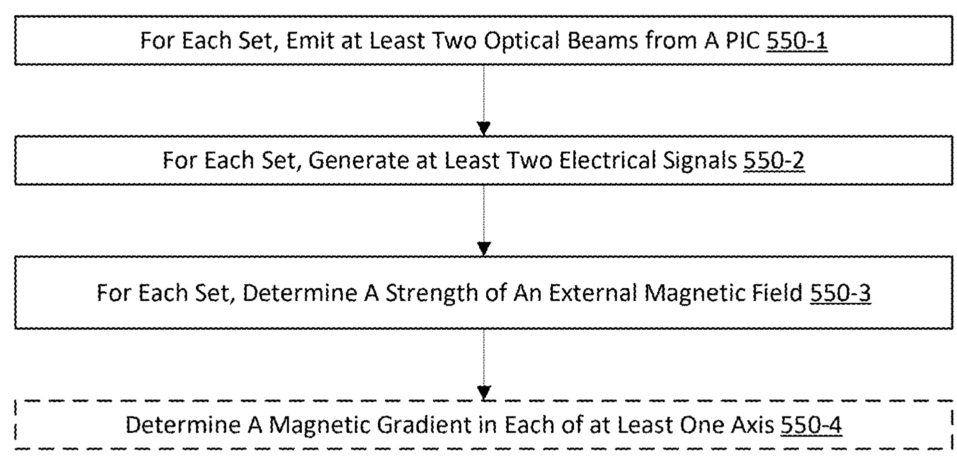

FIG. 5 illustrates a flow diagram of one embodiment of a method 550 of operating an apparatus including at least one atomic magnetometer according to embodiments of the invention. Exemplary method 550 may be implemented by one or more of the apparatuses illustrated in FIGS. 1-4B. To the extent the methods herein are described herein as being implemented with the apparatus illustrated in FIGS. 1-4B, it is to be understood that other embodiments can be implemented in other ways. Techniques described with respect to the embodiments illustrated by FIGS. 1-4B may be applicable to the method 550.

The blocks of the flow diagrams herein have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 550-1, for set of at least two grating coupled surface emitters, at least two optical beams are emitted from at least one PIC. Each PIC may be implemented as described herein or in alternative ways. Optionally, each of the at least two optical beams is emitted along a direction of emission and through a portion, e.g., a unique portion, of a vapor of atoms in a measurement volume in an atomic magnetic sensor vacuum chamber, e.g., of an atomic magnetometer. Each of the at least two optical beams is emitted from a unique grating coupled surface emitter formed on a photonic integrated circuit. Each of the at least two optical beams is emitted along a direction of emission, through a portion, e.g., a unique portion, of a vapor of atoms, and to an optical detector, e.g., unique optical detector. A change in the optical energy of the at least two optical beams, e.g., a change in an average of the optical energy of the at least two optical beams, is proportional to a change of an external magnetic field.

In block 550-2, for each set of at least two grating coupled surface emitters, at least two electrical signals are generated. Each electrical signal is generated by a unique optical detector upon which optical beam(s), e.g., a unique optical beam, is incident after propagating through a portion, e.g., a unique portion, of a vapor of atoms. Each electrical signal has a parameter value (e.g., a current value or a voltage value). The parameter value is proportional to the optical energy of the optical beam(s) incident upon a unique optical detector which generates the parameter value.

In block 550-3, for each set of at least two grating coupled surface emitters, a strength of an external magnetic field in portions, of the vapor of atoms, through which the at least two optical beams propagate, is determined. Techniques for doing so are described elsewhere herein.

In optional block 550-4, a magnetic gradient is determined in each of at least one axis. Optional block 550-4 may be implemented as described elsewhere herein or in other ways; centroids of at least two measurement volumes lie along each axis as described elsewhere herein. This may be accomplished in different ways including without limitation as illustrated elsewhere herein when measurement geometric centers of only two atomic magnetometers are in an axis or by, e.g., using linear regression, to determine the magnetic gradient for each axis.

While the present teachings have been illustrated with respect to one or more implementations, alterations and/or modifications can be made to the illustrated examples without departing from the scope of the appended claims. In addition, while a particular feature of the present disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and/or the claims, such terms are intended to be inclusive in a manner similar to the term "comprising." The term "at least one of" is used to mean one or more of the listed items can be selected. As used herein, the term "one or more of" with respect to a listing of items such as, for example, A and B or A and/or B, means A alone, B alone, or A and B. The term "at least one of" is used to mean one or more of the listed items can be selected.

A processing system may include processor circuitry coupled to memory circuitry. The processor circuitry described herein may include one or more microprocessors, microcontrollers, digital signal processing (DSP) elements, application-specific integrated circuits (ASICs), and/or field programmable gate arrays (FPGAs). In this exemplary embodiment, processor circuitry includes or functions with software programs, firmware, or other computer readable instructions for carrying out various process tasks, calculations, and control functions, used in the methods described herein. These instructions are typically tangibly embodied on any storage media (or computer readable medium) used for storage of computer readable instructions or data structures.

The memory circuitry described herein can be implemented with any available storage media (or computer readable medium) that can be accessed by a general purpose or special purpose computer or processor, or any programmable logic device. Suitable computer readable medium may include storage or memory media such as semiconductor, magnetic, and/or optical media. For example, computer readable media may include conventional hard disks, Compact Disk-Read Only Memory (CD-ROM), DVDs, volatile or non-volatile media such as Random Access Memory (RAM) (including, but not limited to, Dynamic Random Access Memory (DRAM)), Read Only Memory (ROM), Electrically Erasable Programmable ROM (EEPROM), and/or flash memory. Combinations of the above are also included within the scope of computer readable media.

Methods (or portions thereof) of the invention can be implemented in computer readable instructions, such as program modules or applications, which may be stored in the computer readable medium that is part of (optionally the memory circuitry) or communicatively coupled to the processing circuitry, and executed by the processing circuitry, optionally the processor circuitry. Generally, program modules or applications include routines, programs, objects, data components, data structures, algorithms, and the like, which perform particular tasks or implement particular abstract data types.

Example Embodiments

Example 1 includes an apparatus for sensing changes in an external magnetic field, the apparatus comprising: a package including an interior surface and an atomic magnetic sensor vacuum chamber; at least one photonic integrated circuit (PIC) mounted on the interior surface and including at least one set of at least two grating coupled surface emitters, and at least one set of at least one planar optical waveguide each of which is coupled to a set of at least two grating coupled surface emitters, wherein each at least one planar optical waveguide is configured to receive a continuous wave optical signal, and wherein each of the at least two grating coupled surface emitters of a set is configured to emit an optical beam; for each set, at least two optical detectors each of which are mounted on and/or in the package, wherein each of the at least two optical detectors is configured to receive an emitted optical beam along a direction of emission between an optical detector and a unique grating coupled surface emitter which emits the emitted optical beam; for each set, at least two portions of a vapor of atoms in the atomic magnetic sensor vacuum chamber, wherein each portion is in one direction of emission; and at least one coil each of which is in and/or on the package and is configured to generate a magnetic field in at least one portion of the vapor of atoms.

Example 2 includes the apparatus of Example 1, wherein the package includes an upper body, a lower body, and bonding material; wherein the bonding material is between the upper body and the lower body; wherein the bonding material is different than material used to form each of the upper body and the lower body.

Example 3 includes the apparatus of Example 2, wherein the upper body and the lower body are formed from undoped silicon and the bonding material is formed from glass.

Example 4 includes the apparatus of any of Examples 1-3, further comprising: a laser optically coupled to each set of at least one planar optical waveguide and configured to generate the continuous wave optical signal; an electrical supply configured to provide direct current (DC) and/or alternating current (AC) to each of the at least one coil; and processing circuitry electrically coupled to each of the at least two optical detectors and configured to determine at least one field strength of the external magnetic field and/or at least one magnetic gradient of the external magnetic field.

Example 5 includes the apparatus of Example 4, further comprising at least one heater in and/or on the package; wherein the electrical supply is configured to provide electrical power to the at least one heater.

Example 6 includes the apparatus of any of Examples 1-5, wherein at least two grating coupled surface emitters of each set are configured to generate optical beams each of which is orthogonal to one another.

Example 7 includes the apparatus of Example 6, wherein the at least two grating coupled surface emitters of each set comprise three grating coupled surface emitters each of with three lines of sight with a 1-1-1 orientation.

Example 8 includes the apparatus of any of Examples 1-7, wherein each grating coupled surface emitter of a set is configured to emit the emitted optical beam with a same type of polarization.

Example 9 includes the apparatus of any of Examples 1-8, wherein each set comprises at least two pairs of grating coupled surface emitters; wherein a first grating coupled surface emitter of a pair is configured to emit a left handed circularly polarized optical beam; wherein a second grating coupled surface emitter of a pair is configured to emit a right handed circularly polarized optical beam; and wherein each of the at least two optical detectors includes a first optical sub-detector configured to receive the left handed circularly polarized optical beam and a second optical sub-detector configured to receive the right handed circularly polarized optical beam.

Example 10 includes a method for sensing changes in an external magnetic field, the method comprising: for each set of at least one set of at least two grating coupled surface emitters, emitting at least two optical beams, wherein each of the at least two optical beams is emitted from a unique grating coupled surface emitter formed on at least one photonic integrated circuit (PIC), along a direction of emission, through a portion of a vapor of atoms in a measurement volume in an atomic magnetic sensor vacuum chamber, and to an optical detector, and wherein the PIC and the vapor of atoms are in a package; for each set of at least two grating coupled optical surface, generating at least two electrical signals, wherein each electrical signal is generated by a unique optical detector upon which one of at least one optical beam is incident after propagating through a unique portion of a vapor of atoms, wherein each electrical signal has a parameter value proportional to optical energy of at least one optical beam incident on the unique optical detector, wherein the unique optical detector is in and/or on the package; and for each set of at least two grating coupled surface emitters, determining a strength of the external magnetic field in portions, of the vapor of atoms, through which the at least two optical beams propagate.

Example 11 includes the method of Example 10, further comprising determining a magnetic gradient in each of at least one axis.

Example 12 includes the method of Example 11, wherein each axis is orthogonal.

Example 13 includes the method of any of Examples 10-12, wherein each pair of directions of emission are orthogonal.

Example 14 includes an apparatus for sensing changes in an external magnetic field, the apparatus comprising: a package including an interior surface and an atomic magnetic sensor vacuum chamber; at least one photonic integrated circuit (PIC) mounted on the interior surface and including at least one set of at least two grating coupled surface emitters, and at least one set of at least one planar optical waveguide each of which is coupled to a set of at least two grating coupled surface emitters, wherein each at least one planar optical waveguide is configured to receive a continuous wave optical signal, and wherein each of the at least two grating coupled surface emitters of a set is configured to emit an optical beam; for each set, at least two optical detectors each of which are mounted on and/or in the package, wherein each of the at least two optical detectors is configured to receive an emitted optical beam along a direction of emission between an optical detector and a unique grating coupled surface emitter which emits the emitted optical beam; for each set, at least two portions of a vapor of atoms in the atomic magnetic sensor vacuum chamber, wherein each portion is in one direction of emission; at least one coil each of which is in and/or on the package and is configured to generate a magnetic field in at least one portion of the vapor of atoms; a laser optically coupled to each set of at least one planar optical waveguide and configured to generate the continuous wave optical signal; an electrical supply configured to provide direct current (DC) and/or alternating current (AC) to each of the at least one coil; and processing circuitry electrically coupled to each of the at least two optical detectors and configured to determine at least one field strength of the external magnetic field and/or at least one magnetic gradient of the external magnetic field.

Example 15 includes the apparatus of Example 14, wherein the package includes an upper body, a lower body, and bonding material; wherein the bonding material is between the upper body and the lower body; wherein the bonding material is different than material used to form each of the upper body and the lower body.

Example 16 includes the apparatus of Example 15, wherein the upper body and the lower body are formed from undoped silicon and the bonding material is formed from glass.

Example 17 includes the apparatus of any of Examples 14-16, further comprising at least one heater in and/or on the package; wherein the electrical supply is configured to provide electrical power to the at least one heater.

Example 18 includes the apparatus of any of Examples 14-17, wherein the at least two grating coupled surface emitters are configured to generate optical beams each of which is orthogonal to one another.

Example 19 includes the apparatus of Example 18, wherein the at least two grating coupled surface emitters comprise three grating coupled surface emitters with three lines of sight with a 1-1-1 orientation.

Example 20 includes the apparatus of any of Examples 14-19, wherein each set comprises at least two pairs of grating coupled surface emitters; wherein a first grating coupled surface emitter of a pair is configured to emit a left handed circularly polarized optical beam; wherein a second grating coupled surface emitter of a pair is configured to emit a right handed circularly polarized optical beam; and wherein each of the at least two optical detectors includes a first optical sub-detector configured to receive the left handed circularly polarized optical beam and a second optical sub-detector configured to receive the right handed circularly polarized optical beam.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. An apparatus for sensing changes in an external magnetic field, the apparatus comprising:

a package including an interior surface and an atomic magnetic sensor vacuum chamber;

at least one photonic integrated circuit (PIC) mounted on the interior surface and including at least one set of at least two grating coupled surface emitters, and at least one set of at least one planar optical waveguide each of which is coupled to a set of at least two grating coupled surface emitters, wherein each at least one planar optical waveguide is configured to receive a continuous wave optical signal, and wherein each of the at least two grating coupled surface emitters of a set is configured to emit an optical beam;

for each set, at least two optical detectors each of which are mounted on and/or in the package, wherein each of the at least two optical detectors is configured to receive an emitted optical beam along a direction of emission between an optical detector and a unique grating coupled surface emitter which emits the emitted optical beam;

for each set, at least two portions of a vapor of atoms in the atomic magnetic sensor vacuum chamber, wherein each portion is in one direction of emission; and at least one coil each of which is in and/or on the package and is configured to generate a magnetic field in at least one portion of the vapor of atoms.

2. The apparatus of claim 1, wherein the package includes an upper body, a lower body, and bonding material;

wherein the bonding material is between the upper body and the lower body;

wherein the bonding material is different than material used to form each of the upper body and the lower body.

3. The apparatus of claim 2, wherein the upper body and the lower body are formed from undoped silicon and the bonding material is formed from glass.

4. The apparatus of claim 1, further comprising:

a laser optically coupled to each set of at least one planar optical waveguide and configured to generate the continuous wave optical signal;

an electrical supply configured to provide direct current (DC) and/or alternating current (AC) to each of the at least one coil; and processing circuitry electrically coupled to each of the at least two optical detectors and configured to determine at least one field strength of the external magnetic field and/or at least one magnetic gradient of the external magnetic field.

5. The apparatus of claim 4, further comprising at least one heater in and/or on the package;

wherein the electrical supply is configured to provide electrical power to the at least one heater.

6. The apparatus of claim 1, wherein at least two grating coupled surface emitters of each set are configured to generate optical beams each of which is orthogonal to one another.

7. The apparatus of claim 6, wherein the at least two grating coupled surface emitters of each set comprise three grating coupled surface emitters each of with three lines of sight with a 1-1-1 orientation.

8. The apparatus of claim 1, wherein each grating coupled surface emitter of a set is configured to emit the emitted optical beam with a same type of polarization.

9. The apparatus of claim 1, wherein each set comprises at least two pairs of grating coupled surface emitters;

wherein a first grating coupled surface emitter of a pair is configured to emit a left handed circularly polarized optical beam;

wherein a second grating coupled surface emitter of a pair is configured to emit a right handed circularly polarized optical beam; and wherein each of the at least two optical detectors includes a first optical sub-detector configured to receive the left handed circularly polarized optical beam and a second optical sub-detector configured to receive the right handed circularly polarized optical beam.

10. A method for sensing changes in an external magnetic field, the method comprising:

for each set of at least one set of at least two grating coupled surface emitters, emitting at least two optical beams, wherein each of the at least two optical beams is emitted from a unique grating coupled surface emitter formed on at least one photonic integrated circuit (PIC), along a direction of emission, through a portion of a vapor of atoms in a measurement volume in an atomic magnetic sensor vacuum chamber, and to an optical detector, and wherein the PIC and the vapor of atoms are in a package;

for each set of at least two grating coupled optical surface, generating at least two electrical signals, wherein each electrical signal is generated by a unique optical detector upon which one of at least one optical beam is incident after propagating through a unique portion of a vapor of atoms, wherein each electrical signal has a parameter value proportional to optical energy of at least one optical beam incident on the unique optical detector, wherein the unique optical detector is in and/or on the package; and for each set of at least two grating coupled surface emitters, determining a strength of the external magnetic field in portions, of the vapor of atoms, through which the at least two optical beams propagate.

11. The method of claim 10, further comprising determining a magnetic gradient in each of at least one axis.

12. The method of claim 11, wherein each axis is orthogonal.

13. The method of claim 10, wherein each pair of directions of emission are orthogonal.

14. An apparatus for sensing changes in an external magnetic field, the apparatus comprising:

a package including an interior surface and an atomic magnetic sensor vacuum chamber;

at least one photonic integrated circuit (PIC) mounted on the interior surface and including at least one set of at least two grating coupled surface emitters, and at least one set of at least one planar optical waveguide each of which is coupled to a set of at least two grating coupled surface emitters, wherein each at least one planar optical waveguide is configured to receive a continuous wave optical signal, and wherein each of the at least two grating coupled surface emitters of a set is configured to emit an optical beam;

for each set, at least two optical detectors each of which are mounted on and/or in the package, wherein each of the at least two optical detectors is configured to receive an emitted optical beam along a direction of emission between an optical detector and a unique grating coupled surface emitter which emits the emitted optical beam;

for each set, at least two portions of a vapor of atoms in the atomic magnetic sensor vacuum chamber, wherein each portion is in one direction of emission;

at least one coil each of which is in and/or on the package and is configured to generate a magnetic field in at least one portion of the vapor of atoms;

a laser optically coupled to each set of at least one planar optical waveguide and configured to generate the continuous wave optical signal;

an electrical supply configured to provide direct current (DC) and/or alternating current (AC) to each of the at least one coil; and processing circuitry electrically coupled to each of the at least two optical detectors and configured to determine at least one field strength of the external magnetic field and/or at least one magnetic gradient of the external magnetic field.

15. The apparatus of claim 14, wherein the package includes an upper body, a lower body, and bonding material;

wherein the bonding material is between the upper body and the lower body;

wherein the bonding material is different than material used to form each of the upper body and the lower body.

16. The apparatus of claim 15, wherein the upper body and the lower body are formed from undoped silicon and the bonding material is formed from glass.

17. The apparatus of claim 14, further comprising at least one heater in and/or on the package;

wherein the electrical supply is configured to provide electrical power to the at least one heater.

18. The apparatus of claim 14, wherein the at least two grating coupled surface emitters are configured to generate optical beams each of which is orthogonal to one another.

19. The apparatus of claim 18, wherein the at least two grating coupled surface emitters comprise three grating coupled surface emitters with three lines of sight with a 1-1-1 orientation.

20. The apparatus of claim 14, wherein each set comprises at least two pairs of grating coupled surface emitters;

wherein a first grating coupled surface emitter of a pair is configured to emit a left handed circularly polarized optical beam;

wherein a second grating coupled surface emitter of a pair is configured to emit a right handed circularly polarized optical beam; and wherein each of the at least two optical detectors includes a first optical sub-detector configured to receive the left handed circularly polarized optical beam and a second optical sub-detector configured to receive the right handed circularly polarized optical beam.

* * * * *